(12) United States Patent
Li et al.

(10) Patent No.: US 11,393,885 B2
(45) Date of Patent: Jul. 19, 2022

(54) DISPLAY SUBSTRATE, DISPLAY APPARATUS, METHOD OF FABRICATING DISPLAY SUBSTRATE, AND PIXEL DEFINITION MATERIAL FOR FORMING PIXEL DEFINITION LAYER OF DISPLAY SUBSTRATE

(71) Applicants: Hefei Xinsheng Optoelectronics Technology Co., Ltd., Anhui (CN); BOE Technology Group Co., Ltd., Beijing (CN)

(72) Inventors: Wei Li, Beijing (CN); Jingjing Xia, Beijing (CN); Bin Zhou, Beijing (CN); Jun Liu, Beijing (CN); Yingbin Hu, Beijing (CN); Guangyao Li, Beijing (CN); Wei Song, Beijing (CN); Tongshang Su, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 587 days.

(21) Appl. No.: 16/333,340

(22) PCT Filed: Nov. 16, 2018

(86) PCT No.: PCT/CN2018/115871
§ 371 (c)(1),
(2) Date: Mar. 14, 2019

(87) PCT Pub. No.: WO2019/205594
PCT Pub. Date: Oct. 31, 2019

(65) Prior Publication Data
US 2021/0335929 A1    Oct. 28, 2021

(30) Foreign Application Priority Data
Apr. 26, 2018    (CN) .......................... 201810385927.X

(51) Int. Cl.
*H01L 27/32* (2006.01)
*H01L 51/56* (2006.01)
(Continued)

(52) U.S. Cl.
CPC ...... *H01L 27/3246* (2013.01); *H01L 27/3283* (2013.01); *H01L 51/56* (2013.01);
(Continued)

(58) Field of Classification Search
None
See application file for complete search history.

(56) References Cited

U.S. PATENT DOCUMENTS

2011/0127502 A1    6/2011  Kim
2014/0346545 A1*  11/2014  Chan .................. H01L 33/58
                                                       257/98
(Continued)

FOREIGN PATENT DOCUMENTS

CN    102110788 A    6/2011
CN    104241329 A   12/2014
(Continued)

OTHER PUBLICATIONS

Wheeler et al., Magnetic Fe3O4—Au core-shell nanostructures for surface enhanced Raman scattering, 524 Ann. Phys. 11, 670-679, 2012 (Year: 2012).*
(Continued)

*Primary Examiner* — Herve-Louis Y Assouman
*Assistant Examiner* — Christopher A Culbert
(74) *Attorney, Agent, or Firm* — Intellectual Valley Law, P.C.

(57) ABSTRACT

A display substrate includes a base substrate; and a single pixel definition layer on the base substrate defining a plurality of subpixel apertures. The single pixel definition layer includes a plurality of hydrophobic particles dispersed in a
(Continued)

main body for enhancing hydrophobicity of a portion of the single pixel definition layer.

17 Claims, 6 Drawing Sheets

(51) Int. Cl.
    *G03F 7/004* (2006.01)
    *G03F 7/031* (2006.01)
    *H01L 51/00* (2006.01)
(52) U.S. Cl.
    CPC ............ *G03F 7/0048* (2013.01); *G03F 7/031* (2013.01); *H01L 51/004* (2013.01); *H01L 2251/303* (2013.01); *H01L 2251/5369* (2013.01)

(56) References Cited

U.S. PATENT DOCUMENTS

| | | | |
|---|---|---|---|
| 2015/0084017 A1* | 3/2015 | Dai | H01L 51/5268 257/40 |
| 2016/0056218 A1 | 2/2016 | Wang et al. | |
| 2016/0379578 A1* | 12/2016 | Seo | H01L 27/1255 345/58 |
| 2018/0138411 A1 | 5/2018 | Hung et al. | |
| 2019/0148468 A1 | 5/2019 | Jia et al. | |
| 2019/0181195 A1 | 6/2019 | Wang et al. | |

FOREIGN PATENT DOCUMENTS

| | | | |
|---|---|---|---|
| CN | 104733505 A | | 6/2015 |
| CN | 105826358 A | | 8/2016 |
| CN | 107602907 A | * | 1/2018 |
| CN | 107602907 A | | 1/2018 |
| CN | 107887423 A | | 4/2018 |
| CN | 207250517 U | | 4/2018 |
| CN | 108091580 A | | 5/2018 |
| CN | 107602907 B | * | 1/2019 |
| JP | 2004119829 A | | 4/2004 |
| JP | 2007095608 A | | 4/2007 |
| JP | 2007227580 A | | 9/2007 |
| WO | 2015043054 A1 | | 4/2015 |

OTHER PUBLICATIONS

Yao et al., Fluorinated poly(meth)acrylate: Synthesis and properties, Polymer, 55, 6197-6211, 2014 (Year: 2014).*
First Office Action in the Chinese Patent Application No. 201810385927.X, dated Feb. 3, 2020; English translation attached.
International Search Report & Written Opinion dated Dec. 28, 2018, regarding PCT/CN2018/115871.
The Extended European Search Report in the European Patent Application No. 18857383.6, dated Jan. 19, 2022.

* cited by examiner

DISPLAY SUBSTRATE, DISPLAY APPARATUS, METHOD OF FABRICATING DISPLAY SUBSTRATE, AND PIXEL DEFINITION MATERIAL FOR FORMING PIXEL DEFINITION LAYER OF DISPLAY SUBSTRATE

CROSS-REFERENCE TO RELATED APPLICATION

This application is a national stage application under 35 U.S.C. § 371 of International Application No. PCT/CN2018/115871, filed Nov. 16, 2018, which claims priority to Chinese Patent Application No. 201810385927.X, filed Apr. 26, 2018, the contents of which are incorporated by reference in the entirety.

TECHNICAL FIELD

The present invention relates to display technology, more particularly, to a display substrate, a display apparatus, a method of fabricating a display substrate, and a pixel definition material for forming a pixel definition layer of a display substrate.

BACKGROUND

An organic light emitting diode include an anode, an organic light emitting layer on the anode, and a cathode on a side of the organic light emitting layer distal to the anode. When a voltage is applied across the anode and the cathode to provide a current, electrons from the cathode are recombined with holes from the anode at the light emitting layer to form excitons, so that the organic material in the light emitting layer is excited to emit light. The organic light emitting layer can be formed by vapor deposition, coating, or ink-jet printing. Prior to forming the organic light emitting layer, a pixel definition layer is first formed to define a plurality of subpixel apertures, and the organic light emitting material is disposed in the plurality of subpixel apertures, e.g., by vapor deposition or ink-jet printing.

SUMMARY

In one aspect, the present invention provides a display substrate, comprising a base substrate; and a single pixel definition layer on the base substrate defining a plurality of subpixel apertures; wherein the single pixel definition layer comprises a plurality of hydrophobic particles dispersed in a main body for enhancing hydrophobicity of a portion of the single pixel definition layer.

Optionally, the plurality of hydrophobic particles are in at least an upper portion of the single pixel definition layer distal to the base substrate; the upper portion of the single pixel definition layer is more hydrophobic than a lower portion of the single pixel definition layer; and the upper portion is on a side of the lower portion distal to the base substrate.

Optionally, the plurality of hydrophobic particles has a first distribution density in the upper portion of the single pixel definition layer and a second distribution density in a lower portion of the single pixel definition layer; and the first distribution density is higher than the second distribution density.

Optionally, the plurality of hydrophobic particles have a gradient distribution such that a distribution density of the plurality of hydrophobic particles decreases in a direction from the upper portion to the lower portion.

Optionally, a ratio of the first distribution density to the second distribution density is greater than 4:1.

Optionally, the plurality of hydrophobic particles are a plurality of hydrophobic nanoparticles.

Optionally, the plurality of hydrophobic nanoparticles are a plurality of hydrophobic magnetic nanoparticles.

Optionally, each of the plurality of hydrophobic particles has a core-shell structure comprising a core portion and a hydrophobic shell portion encapsulating the core portion.

Optionally, the core portion is a magnetic core portion comprising a magnetic material.

Optionally, the core portion comprises $Fe_3O_4$; the hydrophobic shell portion comprises one or a combination of a fluorinated polydopamine, a block copolymer of methyl methacrylate and dodecafluoroheptyl methacrylate, or a block copolymer of methyl methacrylate and pentafluorostyrene; and the main body comprises polymethacrylate.

Optionally, the display substrate further comprises an organic light emitting layer in the plurality of subpixel apertures.

In another aspect, the present invention provides a display apparatus, comprising the display substrate described herein or fabricated by a method described herein, and a counter substrate facing the display substrate, wherein the display substrate further comprising an organic light emitting layer in the plurality of subpixel apertures.

In another aspect, the present invention provides a method of fabricating a display substrate, comprising forming a pixel definition layer on a base substrate defining a plurality of subpixel apertures; wherein forming the pixel definition layer comprises dispersing a plurality of hydrophobic particles in a main body for enhancing hydrophobicity of a portion of the pixel definition layer.

Optionally, the plurality of hydrophobic particles are a plurality of hydrophobic magnetic particles; forming the pixel definition layer further comprises coating a mixture comprising the plurality of hydrophobic particles dispersed in the main body on the base substrate to form a coating layer; applying a magnetic field to the plurality of hydrophobic particles such that the plurality of hydrophobic particles are enriched in an upper portion of the coating layer distal to the base substrate; curing the coating layer having the plurality of hydrophobic particles enriched in an upper portion of the coating layer to form a cured coating layer; and patterning the cured coating layer to form the plurality of subpixel apertures, thereby forming the pixel definition layer.

Optionally, the pixel definition layer is formed so that the plurality of hydrophobic particles has a first distribution density in the upper portion of the pixel definition layer and a second distribution density in a lower portion of the pixel definition layer; and the first distribution density is higher than the second distribution density.

Optionally, the pixel definition layer is formed so that the plurality of hydrophobic particles have a gradient distribution such that a distribution density of the plurality of hydrophobic particles decreases in a direction from the upper portion to the lower portion.

Optionally, the method further comprises disposing an ink comprising an organic light emitting material into the plurality of subpixel apertures.

In another aspect, the present invention provides a pixel definition material for forming a pixel definition layer of a display substrate, comprising a main body material; and a plurality of hydrophobic particles dispersed in the main body material.

Optionally, the plurality of hydrophobic particles are a plurality of hydrophobic magnetic nanoparticles.

Optionally, each of the plurality of hydrophobic particles has a core-shell structure comprising a core portion and a hydrophobic shell portion encapsulating the core portion; the main body material comprises a polymer, a photo-initiator, a monomer, and a solvent; the photo-initiator comprises one or a combination of nitroaniline, anthracene, benzophenone, and N-acetyl-4-nitronaphthylamine; the monomer comprises one or a combination of dipentaerythritol pentaacrylate, dipentaerythritol hexaacrylate, urethane acrylate, and pentoxide tetraol tetraacrylate; and the solvent comprises one or a combination of N-methylpyrrolidone, glycol ether, ethylene glycol alkyl ether acetate, diethylene glycol, propylene glycol monomethyl ether acetate, ethoxyethyl acetate, dimethoxy acetaldehyde, propylene glycol methyl ether acetate, ethyl 3-ethoxypropionate, propylene glycol methyl ether, and ethylene glycol acetate.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, a display substrate, a display apparatus, a method of fabricating a display substrate, and a pixel definition material for forming a pixel definition layer of a display substrate that substantially obviate one or more of the problems due to limitations and disadvantages of the related art. In one aspect, the present disclosure provides a display substrate. In some embodiments, the display substrate includes a base substrate; and a pixel definition layer on the base substrate defining a plurality of subpixel apertures. Optionally, the pixel definition layer includes a plurality of hydrophobic particles dispersed in a main body for enhancing hydrophobicity of a portion of the pixel definition layer. Optionally, the pixel definition layer in the present disclosure is a single pixel definition layer.

Figure 1:
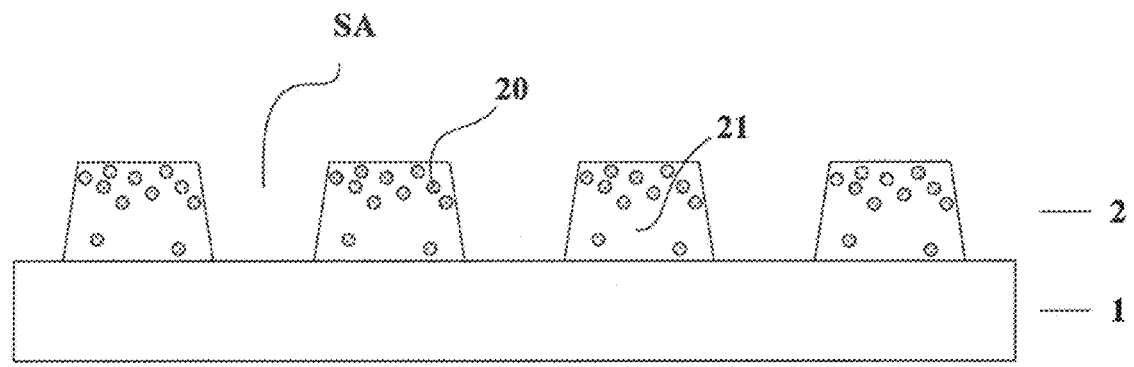
FIG. 1 is a cross-sectional view of a display substrate in some embodiments according to the present disclosure.
Figure 2:
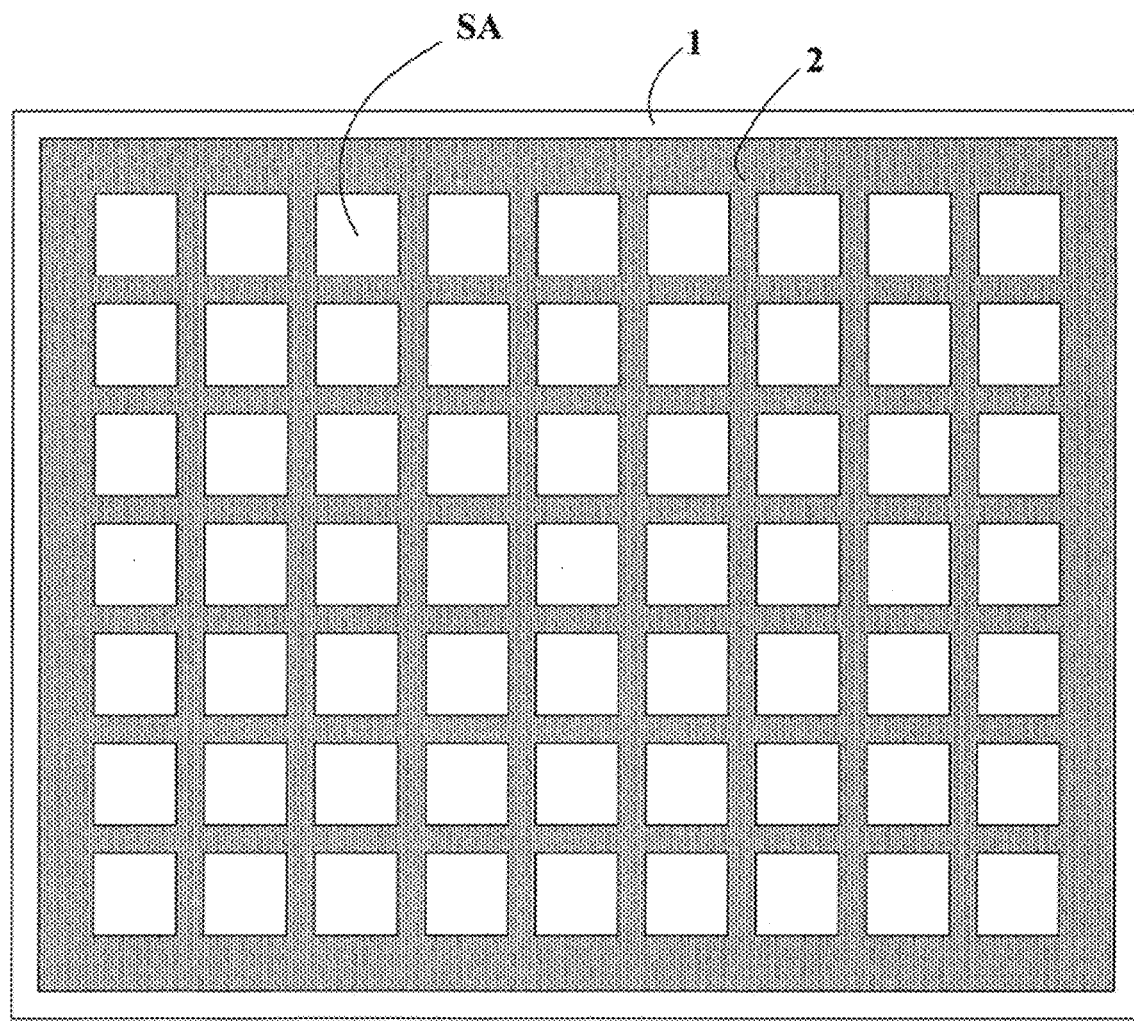
FIG. 2 is a plan view of a display substrate in some embodiments according to the present disclosure.

FIG. 1 is a cross-sectional view of a display substrate in some embodiments according to the present disclosure. FIG. 2 is a plan view of a display substrate in some embodiments according to the present disclosure. Referring to FIG. 1 and FIG. 2, the display substrate in some embodiments includes a base substrate 1; and a pixel definition layer 2 on the base substrate 1 defining a plurality of subpixel apertures SA. The pixel definition layer 2 includes a plurality of hydrophobic particles 20 dispersed in a main body 21 for enhancing hydrophobicity of a portion of the pixel definition layer 2. For example, the plurality of hydrophobic particles 20, or at least a surface of each of the plurality of hydrophobic particles 20, have a first hydrophobicity higher than a second hydrophobicity of the main body. Hydrophobicity can be measured by, e.g., contact angles of a liquid droplet placed on the hydrophobic material. Optionally, a ratio of the first hydrophobicity to the second hydrophobicity is in a range of approximately 1.05:1 to 10:1, e.g., 1.05:1 to 1.1:1, 1.1:1 to 2:1, 2:1 to 4:1, 4:1 to 6:1, 6:1 to 8:1, and 8:1 to 10:1.

Figure 3A:
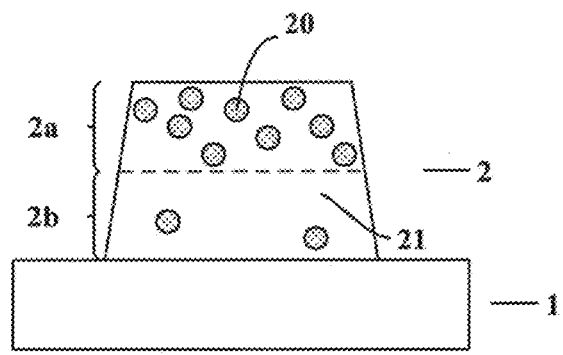
FIGS. 3A to 3C are schematic diagrams illustrating the structures of a pixel definition layer in some embodiments according to the present disclosure.
Figure 3B:
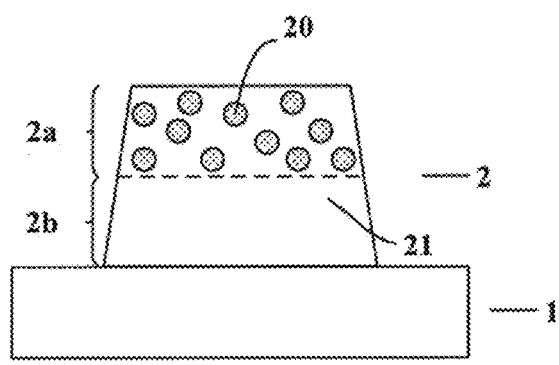
Figure 3C:
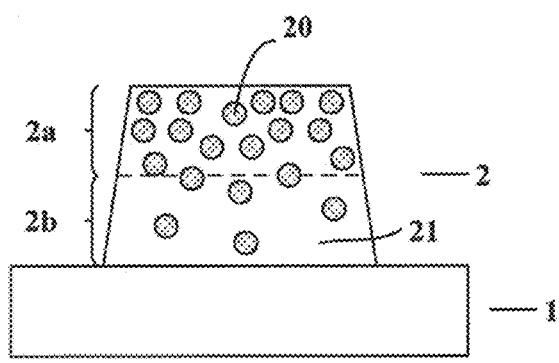

FIGS. 3A to 3C are schematic diagrams illustrating the structures of a pixel definition layer in some embodiments according to the present disclosure. Referring to FIGS. 3A to 3C, the plurality of hydrophobic particles 20 are in at least an upper portion 2a of the pixel definition layer distal to the base substrate 10. The upper portion 2a of the pixel definition layer 2 is more hydrophobic than a lower portion 2b of the pixel definition layer 2. The upper portion 2a is on a side of the lower portion 2b distal to the base substrate 1. The upper portion 2a and the lower portion 2b may be an upper half portion and a lower half portion of the pixel definition layer 2. Optionally, the upper portion 2a and the lower portion 2b may have any appropriate percentage of the pixel definition layer 2. Optionally, the upper portion 2a and the lower portion 2b are formed as an integral layer, and the division of the upper portion 2a and the lower portion 2b are artificial. Optionally, the upper portion 2a and the lower portion 2b are formed in two patterning process, for example, the upper portion 2a and the lower portion 2b are two sub-layers of the pixel definition layer 2.

Referring to FIGS. 3A to 3C, in some embodiments, the plurality of hydrophobic particles 20 has a first distribution density in the upper portion 2a of the pixel definition layer 2 and a second distribution density in a lower portion 2b of the pixel definition layer 2. The first distribution density is higher than the second distribution density. Referring to FIG. 3A, in some embodiments, the plurality of hydrophobic particles 20 are present in both the upper portion 2a and the lower portion 2b. Referring to FIG. 3B, in some embodiments, the plurality of hydrophobic particles 20 are present only in the upper portion 2a but absent in the lower portion 2b. Referring to FIG. 3C, in some embodiments, the plurality of hydrophobic particles 20 have a gradient distribution such that a distribution density of the plurality of hydrophobic particles 20 decreases in the direction from the upper portion 2a to the lower portion 2b. Optionally, a ratio of the first distribution density to the second distribution density is greater than 2:1, e.g., greater than 3:1, greater than 4:1, greater than 5:1, greater than 10:1, greater than 20:1, and greater than 50:1.

In some embodiments, the plurality of hydrophobic particles 20 are a plurality of hydrophobic nanoparticles. As used herein, the term "nanoparticle" refers to a particle that has at least one region or characteristic dimension with a dimension of less than approximately 500 nm, including on the order of less than approximately 250 nm (e.g., less than approximately 200 nm). As used herein when referring to any numerical value, the term "approximately" refers to a value of ±10% of the stated value. Optionally, nanoparticles are less than approximately 500 nm, less than approximately 400 nm, less than approximately 300 nm, less than approximately 250 nm, less than approximately 200 nm, less than approximately 150 nm, less than approximately 100 nm, less than approximately 50 nm, less than approximately 25 nm, and less than approximately 10 nm, in at least one characteristic dimension (e.g., the dimension across the width or length of the nanostructure). Optionally, the nanoparticles have a diameter in a range of approximately 5 nm to approximately 10 nm. Nanoparticles may have various suitable shapes such as a spherical shape, a cylindrical shape (including a right cylindrical shape and an elliptical cylindrical shape), a cubical shape, a rod shape, a cone shape, a triangular prism shape, a pyramid shape, a rectangular prism shape, a hexagonal prism shape, etc. Similarly, a cross-section of a nanoparticle may have various suitable shapes such as a circular shape, an elliptical shape, a square, a regular polygon, a triangle, a rectangular shape, a hexagon shape, etc.

Optionally, each of the plurality of hydrophobic particles 20 has a visible boundary with the main body 21. Optionally, a boundary between each of the plurality of hydrophobic particles 20 and the main body 21 is not visible, but nonetheless chemically distinct from the main body 21.

In some embodiments, the plurality of hydrophobic particles 20 are a plurality of hydrophobic magnetic nanoparticles.

Figure 4A:
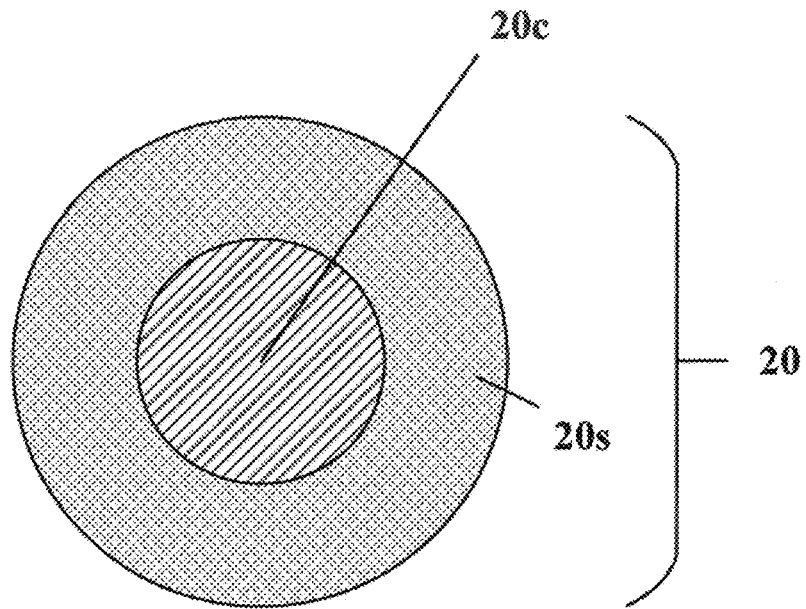
FIGS. 4A and 4B illustrate the structures of hydrophobic particles in some embodiments according to the present disclosure.
Figure 4B:
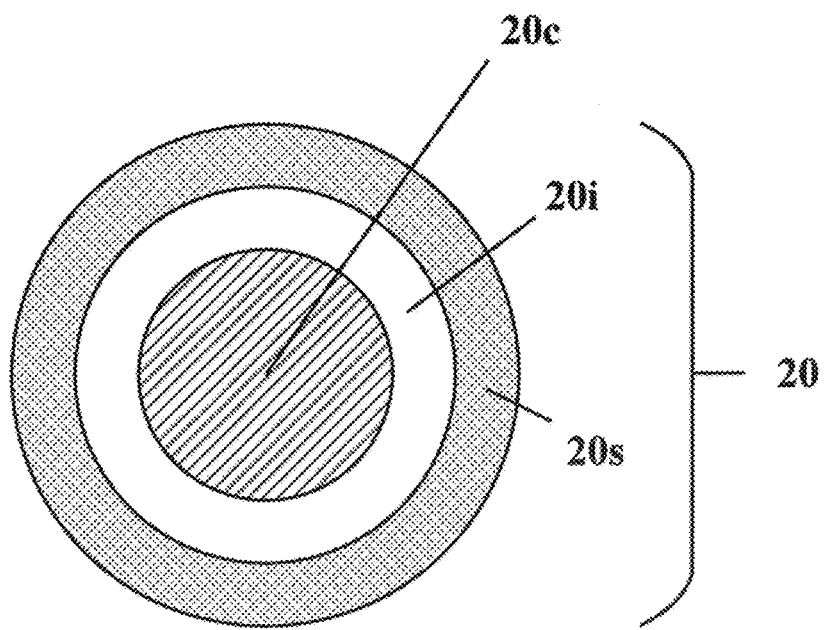

In some embodiments, each of the plurality of hydrophobic particles 20 has a core-shell structure including a core portion and a hydrophobic shell portion encapsulating the core portion. FIGS. 4A and 4B illustrate the structures of hydrophobic particles in some embodiments according to the present disclosure. Referring to FIG. 4A, each of the plurality of hydrophobic particles 20 has a core-shell structure including a core portion 20c and a hydrophobic shell portion 20s encapsulating the core portion 20c. Referring to FIG. 4B, in some embodiments, the core-shell structure further includes an intermediate portion 20i between the core portion 20c and the hydrophobic shell portion 20s, for example, the hydrophobic shell portion 20s encapsulates the intermediate portion 20i, and the intermediate portion 20i encapsulates the core portion 20c.

Optionally, the core portion 20c is a magnetic core portion including a magnetic material such as $Fe_3O_4$. Optionally, the hydrophobic shell portion 20s includes a hydrophobic material. Optionally, the hydrophobic shell portion 20s includes one or a combination of a fluorinated polydopamine, a block copolymer of methyl methacrylate and dodecafluoroheptyl methacrylate, or a block copolymer of methyl methacrylate and pentafluorostyrene. Optionally, the main body 21 includes polymethacrylate.

The pixel definition layer 2 may have any appropriate shape. For example, a cross-section of the pixel definition layer 2 along a plane perpendicular to the base substrate 1 and along a middle line of one or more of the plurality of subpixel apertures may have any appropriate shapes, e.g., a trapezoidal shape or an inverted trapezoidal shape. Optionally, the cross-section has a trapezoidal shape, the shorter base of which is on a side of the longer base distal to the base substrate 1. By having a trapezoidal shape, the pixel definition layer 2 can effectively prevent cross-contamination of an ink disposed in the plurality of subpixel apertures SA, and also facilitate the ink to spread out on the bottom of each of the plurality of subpixel apertures SA.

Figure 5:
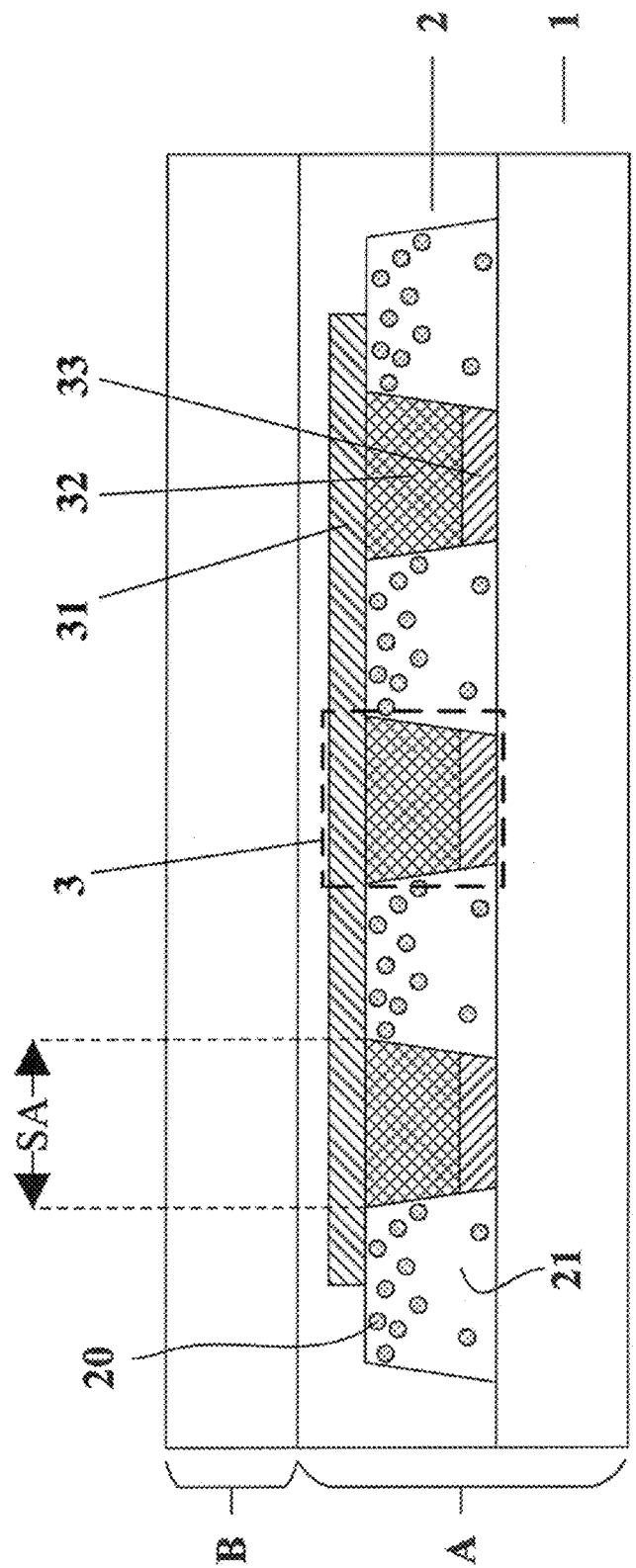
FIG. 5 is a schematic diagram illustrating the structure of a display panel in some embodiments according to the present disclosure.

In another aspect, the present disclosure further provides a display panel. The display panel includes a display substrate as described herein, and a counter substrate facing the display substrate. FIG. 5 is a schematic diagram illustrating the structure of a display panel in some embodiments according to the present disclosure. Referring to FIG. 5, the display panel in some embodiments includes a display substrate A and a counter substrate B facing the display substrate A. The display substrate A and the counter substrate B are assembled together to form the display panel. As shown in FIG. 5, in some embodiments, the display substrate A further includes a plurality of light emitting elements 3. Optionally, the plurality of light emitting elements 3 are a plurality of organic light emitting diodes. Each of the plurality of light emitting elements 3 includes a first electrode 31, an organic light emitting layer 32 on a side of the first electrode 31 distal to the base substrate 1 and in the plurality of subpixel apertures SA, and a second electrode 33 on a side of the organic light emitting layer 32 distal to the base substrate 1. Optionally, the counter substrate B includes a color filter and a black matrix.

In another aspect, the present disclosure further provides a display apparatus including the display panel described herein. Optionally, the display apparatus further includes one or more integrated circuits. In some embodiments, the display apparatus includes a plurality of subpixels arranged in an array having a plurality of rows and a plurality of columns. Optionally, each of the plurality of subpixels includes at least one thin film transistor for driving light emission of the subpixel. Examples of appropriate display apparatuses include, but are not limited to, an electronic paper, a mobile phone, a tablet computer, a television, a monitor, a notebook computer, a digital album, a GPS, etc.

In another aspect, the present disclosure further provides a method of fabricating a display substrate. In some embodiments, the method includes forming a pixel definition layer on a base substrate defining a plurality of subpixel apertures. In some embodiments, the step of forming the pixel definition layer includes dispersing a plurality of hydrophobic particles in a main body for enhancing hydrophobicity of a portion of the pixel definition layer. Optionally, the plurality of hydrophobic particles are disposed in at least an upper portion of the pixel definition layer distal to the base substrate. As a result, the upper portion of the pixel definition layer is more hydrophobic than a lower portion of the pixel definition layer, the upper portion being on a side of the lower portion distal to the base substrate. Optionally, the pixel definition layer is formed so that the plurality of hydrophobic particles has a first distribution density in the upper portion of the pixel definition layer and a second distribution density in a lower portion of the pixel definition layer, the first distribution density being higher than the second distribution density. Optionally, the pixel definition layer is formed so that the plurality of hydrophobic particles have a gradient distribution such that a distribution density of the plurality of hydrophobic particles decreases in the direction from the upper portion to the lower portion. Optionally, a ratio of the first distribution density to the second distribution density is greater than 4:1. Optionally, the plurality of hydrophobic particles are a plurality of hydrophobic nanoparticles. Optionally, the plurality of hydrophobic nanoparticles are a plurality of hydrophobic magnetic nanoparticles.

In some embodiments, forming each of the plurality of hydrophobic particles is formed to have a core-shell structure comprising a core portion and a hydrophobic shell portion encapsulating the core portion. Optionally, the core portion is a magnetic core portion comprising a magnetic material.

Various appropriate methods may be used to distribute the plurality of hydrophobic particles between the upper portion and the lower portion of the pixel definition layer. For example, the plurality of hydrophobic particles may have a density lower than that of the main body. When a mixture including the plurality of hydrophobic particles dispersed in the main body is coated on the base substrate, the plurality of hydrophobic particles are enriched in the upper portion simply because the plurality of hydrophobic particles are more buoyant than the main body. Subsequently, the mixture is cured and patterned to form the pixel definition layer. Other means, including mechanical, electrical, optical, thermal, may be utilized to distribute the plurality of hydrophobic particles between the upper portion and the lower portion.

The plurality of hydrophobic particles may enhance the hydrophobicity of an adjacent portion of the pixel definition layer by any appropriate mechanisms. Optionally, the plurality of hydrophobic particles enhance the hydrophobicity of a directly adjacent portion of the pixel definition layer simply because the plurality of hydrophobic particles have a relatively higher hydrophobicity. Optionally, the plurality of hydrophobic particles may impart higher hydrophobicity to the adjacent portion of the pixel definition layer by interaction with the molecules in the main body. Optionally, the plurality of hydrophobic particles may impart higher hydrophobicity to the adjacent portion of the pixel definition layer by reaction with the molecules in the main body. In one example, the plurality of hydrophobic particles may diffuse a molecule of higher hydrophobicity into the adjacent portion of the pixel definition layer thereby enhancing the hydrophobicity.

Figure 6:
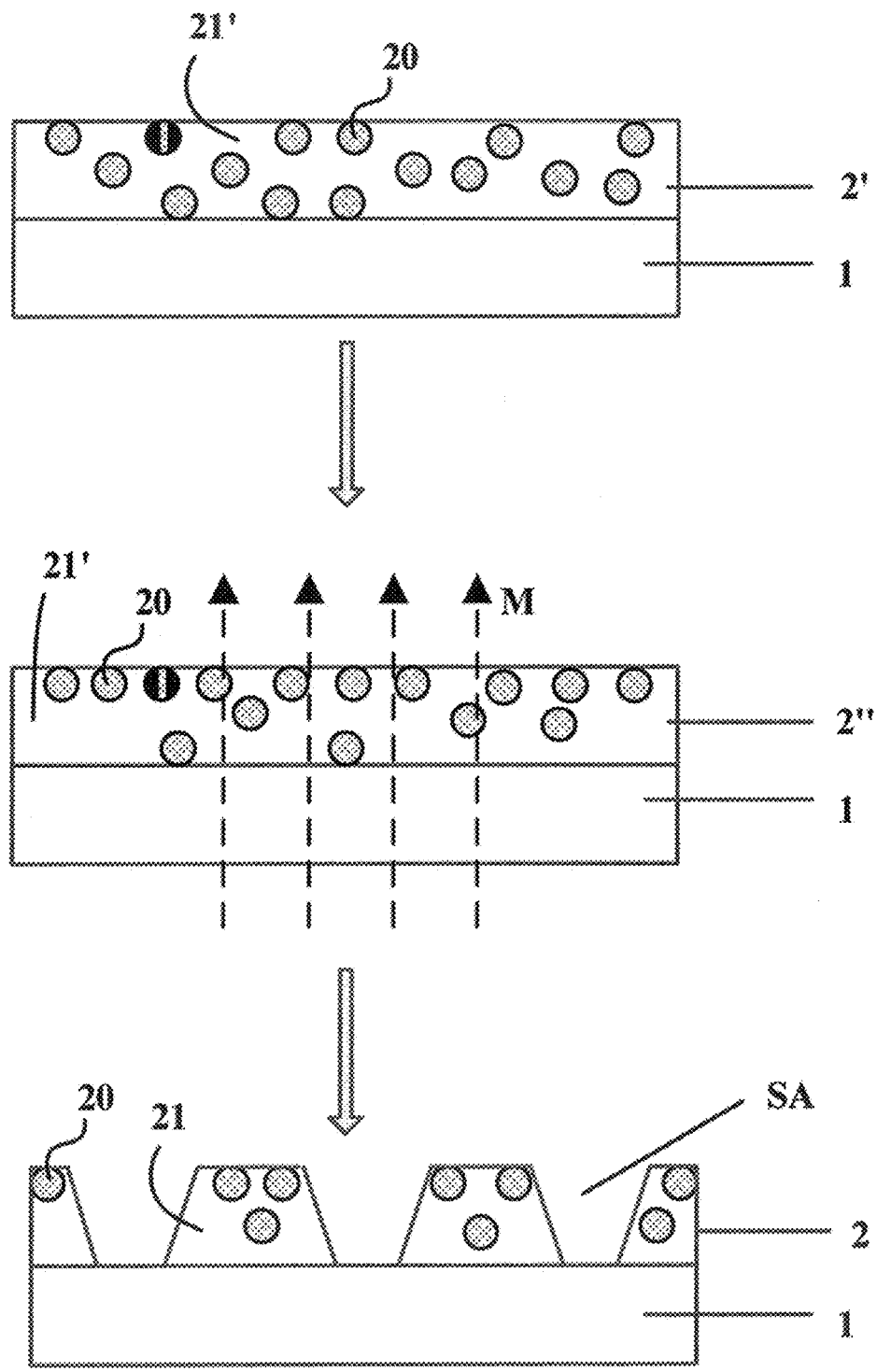
FIG. 6 illustrates a method of fabricating a display substrate in some embodiments according to the present disclosure.

FIG. 6 illustrates a method of fabricating a display substrate in some embodiments according to the present disclosure. Referring to FIG. 6, a mixture including the plurality of hydrophobic particles 20 dispersed in a main body material 21' is coated on the base substrate 1 to form a coating layer 2'. The main body material 21' in one example may be a photoresist material which can be cured in subsequent steps. A magnetic field M is then applied to the plurality of hydrophobic particles 20 such that the plurality of hydrophobic particles 20 are enriched in an upper portion of the coating layer 2' distal to the base substrate 1, e.g., by magnetic attraction or magnetic repulsion. The coating layer 2' is cured (e.g., dried under vacuum) to formed a cured coating layer 2''. Subsequently, the cured coating layer 2'' is patterned (e.g., in a lithographic process) to form a plurality of subpixel apertures SA, thereby forming the pixel definition layer 2.

Optionally, the magnetic field M has a magnetic flux density in a range of 0.01 T to 0.2 T. Optionally, the magnetic field M is applied for a duration of 10 seconds to 100 seconds.

Optionally, the plurality of hydrophobic particles 20 are a plurality of hydrophobic magnetic nanoparticles.

Optionally, the mixture for forming the coating layer 2' includes 5% to 30% w/w polymethacrylate or derivatives thereof 0.5% to 1% w/w hydrophobic magnetic nanoparticles, 0.5% to 2% w/w photo-initiator, 0.1% to 1% w/w monomer, 0.1% to 1% w/w additive, and a solvent.

In some embodiments, the method further includes disposing an ink including an organic light emitting material into the plurality of subpixel apertures. Because the upper portion of the pixel definition layer is more hydrophobic, it prevents the ink from flowing out of one or more of the plurality of subpixel apertures. Because the lower portion of the pixel definition layer is less hydrophobic, the ink can readily spread out at the bottom of the plurality of subpixel apertures.

In another aspect, the present disclosure provides a pixel definition material for forming a pixel definition layer of a display substrate. In some embodiments, the pixel definition material includes a main body material, and a plurality of hydrophobic particles dispersed in the main body material. Optionally, the plurality of hydrophobic particles, or at least a surface of each of the plurality of hydrophobic particles, have a first hydrophobicity higher than a second hydrophobicity of the main body material. Optionally, a ratio of the first hydrophobicity to the second hydrophobicity is in a range of approximately 1.05:1 to 10:1, e.g., 1.05:1 to 1.1:1, 1.1:1 to 2:1, 2:1 to 4:1, 4:1 to 6:1, 6:1 to 8:1, and 8:1 to 10:1.

In some embodiments, the main body material includes a polymer, a photo-initiator, a monomer, and a solvent. Optionally, the main body material further includes an additive.

In some embodiments, the plurality of hydrophobic nanoparticles are a plurality of hydrophobic magnetic nanoparticles. Optionally, each of the plurality of hydrophobic magnetic nanoparticles has a core-shell structure comprising a core portion and a hydrophobic shell portion encapsulating the core portion. Optionally, the core portion includes $Fe_3O_4$. Optionally, the hydrophobic shell portion includes one or a combination of a fluorinated polydopamine, a block copolymer of methyl methacrylate and dodecafluoroheptyl methacrylate, or a block copolymer of methyl methacrylate and pentafluorostyrene. Optionally, the polymer of the main body material includes polymethacrylate. The hydrophobic shell portion includes a hydrophobic material that is compatible with the main body material and compatible with the other portions of the plurality of hydrophobic magnetic nanoparticles. The hydrophobic shell portion imparts the enhanced hydrophobicity, e.g., to the upper portion of the pixel definition layer to be formed.

Optionally, the core-shell structure further includes an intermediate portion between the core portion and the hydrophobic shell portion, for example, the hydrophobic shell portion encapsulates the intermediate portion, and the intermediate portion 20i encapsulates the core portion. Optionally, the intermediate portion includes silicon dioxide. The intermediate portion binds the core portion and the hydrophobic shell portion together.

In one example, the main body material includes 5% to 30% w/w polymethacrylate or derivatives thereof 0.5% to 1% w/w hydrophobic magnetic nanoparticles, 0.5% to 2% w/w photo-initiator, 0.1% to 1% w/w monomer, and 0.1% to 1% w/w additive, and a solvent.

The plurality of hydrophobic magnetic nanoparticles am hydrophobic and magnetic. Upon application of a magnetic field, the plurality of hydrophobic magnetic nanoparticles can have an enriched distribution in the upper portion of the coating layer as compared to the lower portion.

Optionally, the plurality of hydrophobic nanoparticles have an average diameter in a range of 5 nm to 10 nm.

Examples of appropriate photo-initiators include nitroaniline, anthracene, benzophenone, and N-acetyl-4-nitronaphthylamine. Examples of appropriate monomers include dipentaerythritol pentaacrylate, dipentaerythritol hexaacrylate, urethane acrylate, and pentoxide tetraol tetraacrylate. Examples of appropriate solvents include N-methylpyrrolidone, glycol ether, ethylene glycol alkyl ether acetate, diethylene glycol, propylene glycol monomethyl ether acetate, ethoxyethyl acetate, dimethoxy acetaldehyde, propylene glycol methyl ether acetate, ethyl 3-ethoxypropionate, propylene glycol methyl ether, and ethylene glycol acetate. Examples of appropriate additives include a polymerization inhibitor, a leveling agent, an anti-foaming agent, and a stabilizer.

Examples of appropriate polymerization inhibitors include 2-sec-butyl-4,6-dinitrophenol, p-tert-butyl catechol, and 2,5-di-tert-butyl hydroquinone. Examples of appropriate leveling agents include an acrylic compound, a silicone compound, and a fluorocarbon compound. Examples of appropriate anti-foaming agents include an emulsified silicone oil, a high alcohol fatty acid ester complex, a polyoxyethylene polyoxypropylene pentaerythritol ether, a polyoxyethylene polyoxypropylene alcohol ether, a polyoxypropylene glyceryl ether, a polyoxypropylene polyoxygen, ethylene glycol ether, and polydimethylsiloxane. Examples of appropriate stabilizers include isoamyl alcohol, n-hexanol, glycerol, and n-hexane.

Upon irradiation of an ultraviolet light, the photo-initiator initiates the cross-lining reaction of the monomer, the polymer (e.g., polymethacrylate or derivatives thereof), and cures the coating layer having the plurality of hydrophobic particles enriched in the upper portion of the coating layer to form a cured coating layer.

Example 1: Preparation of Hydrophobic Magnetic Nanoparticles Having $Fe_3O_4$ as the Core Portion, $SiO_2$ as the Intermediate Portion, and Fluorinated Polydopamine as the Hydrophobic Shell Portion $Fe_3O_4$ nanoparticles and silane coupling agent were dispersed in a solution containing water and ethanol, and mixed. Ammonia and ethyl orthosilicate were then added into the mixture, the reaction is conducted at room temperature to obtain nanoparticles having $Fe_3O_4$ as a core portion and a thin layer of silicon dioxide encapsulating the $Fe_3O_4$ core portion. The nanoparticles were then added into a buffer solution (Tri-Hcl) containing dopamine, reaction is conducted at room temperature to obtain polydopamine-costed magnetic $SiO_2$ nanoparticles. The nanoparticles were then immersed in a solution of perfluorodecyltrichlorosilane in n-hexane to obtain hydrophobic magnetic nanoparticles having $Fe_3O_4$ as the core portion, $SiO_2$ as the intermediate portion encapsulating the $Fe_3O_4$ core portion, and fluorinated polydopamine as the hydrophobic shell portion encapsulating the $SiO_2$ intermediate portion.

Example 2: Preparation of Hydrophobic Magnetic Nanoparticles Having $Fe_3O_4$ as the Core Portion, $SiO_2$ as the Intermediate Portion, and a Block Copolymer of Methyl Methacrylate and Dodecafluoroheptyl Methacrylate as the Hydrophobic Shell Portion $Fe_3O_4$ nanoparticles and silane coupling agent were dispersed in a solution containing water and ethanol, and mixed. Ammonia and ethyl orthosilicate (TEOS) were then added into the mixture, the reaction is conducted at room temperature to obtain nanoparticles having $Fe_3O_4$ as a core portion and a thin layer of silicon dioxide encapsulating the $Fe_3O_4$ core portion. The nanoparticles were then added into a toluene solution containing aminopropyltriethoxysilane (APTES), reaction is conducted to obtain $Fe_3O_4/SiO_2$—NH2 nanoparticles. The nanoparticles were then reacted with bromoisobutyryl bromide to obtain $Fe_3O_4/SiO_2$—Br nanoparticles. The $Fe_3O_4/SiO_2$—Br nanoparticles were then dispersed in cyclohexnone, and react with methacrylic acid ester (MMA) in a nitrogen atmosphere to obtain polymethyl methacrylate coated $Fe_3O_4/SiO_2$ nanoparticles. The polymethyl methacrylate coated $Fe_3O_4/SiO_2$ nanoparticles were then dispersed in cyclohexnone, and react with dodecafluoroheptyl methacrylate in a nitrogen atmosphere to obtain hydrophobic magnetic nanoparticles having $Fe_3O_4$ as the core portion, SiO2 as the intermediate portion, and a block copolymer of methyl methacrylate and dodecafluoroheptyl methacrylate as the hydrophobic shell portion. The avenge diameter of the nanoparticles is approximately 10 nm.

Example 3: Preparation of Hydrophobic Magnetic Nanoparticles Having $Fe_3O_4$ as the Core Portion, SiO2 as the Intermediate Portion, and a Block Copolymer of Methyl Methacrylate and Pentafluorostyrene as the Hydrophobic Shell Portion $Fe_3O_4$ nanoparticles and silane coupling agent were dispersed in a solution containing water and ethanol, and mixed. Ammonia and ethyl orthosilicate (TEOS) were then added into the mixture, the reaction is conducted at room temperature to obtain nanoparticles having $Fe_3O_4$ as a core portion and a thin layer of silicon dioxide encapsulating the $Fe_3O_4$ core portion. The nanoparticles were then added into a toluene solution containing aminopropyltriethoxysilane (APTES), reaction is conducted to obtain $Fe_3O_4/SiO_2$—NH2 nanoparticles. The nanoparticles were then reacted with bromoisobutyryl bromide to obtain $Fe_3O_4/SiO_2$—Br nanoparticles. The $Fe_3O_4/SiO_2$—Br nanoparticles were then dispersed in cyclohexnone, and react with methacrylic acid ester (MMA) in a nitrogen atmosphere to obtain polymethyl methacrylate coated $Fe_3O_4/SiO_2$ nanoparticles. The polymethyl methacrylate coated $Fe_3O_4/SiO_2$ nanoparticles were then dispersed in cyclohexnone, and react with 2,3,4,5,6-pentafluorostyrene in a nitrogen atmosphere to obtain hydrophobic magnetic nanoparticles having $Fe_3O_4$ as the core portion, SiO2 as the intermediate portion, and a block copolymer of methyl methacrylate and pentafluorostyrene as the hydrophobic shell portion. The average diameter of the nanoparticles is approximately 10 nm.

Example 4: Preparation of a Mixture for Forming the Coating Layer $Fe_3O_4$ nanoparticles and silane coupling agent KH560 were dispersed in a solution containing water and ethanol, and mixed at 80 degrees for 2 hours. Ammonia and ethyl orthosilicate were then added into the mixture, the reaction is conducted at room temperature for 12 hours to obtain nanoparticles having $Fe_3O_4$ as a core portion and a thin layer of silicon dioxide encapsulating the $Fe_3O_4$ core portion. The nanoparticles were then added into a buffer solution (Tri-Hcl) containing dopamine, reaction is conducted at room temperature for 12 hours to obtain polydopamine-coated magnetic $SiO_2$ nanoparticles. The nanoparticles were then immersed in a solution of 0.025% (v/v) perfluorodecyltrichlorosilane in n-hexane to obtain hydrophobic magnetic nanoparticles having $Fe_3O_4$ as the core portion, $SiO_2$ as the intermediate portion encapsulating the $Fe_3O_4$ core portion, and fluorinated polydopamine as the hydrophobic shell portion encapsulating the $SiO_2$ intermediate portion.

A mixture for forming the coating layer was prepared by mixing 5% to 30% w/w polymethacrylate, 0.5% to 1% w/w hydrophobic magnetic nanoparticles as prepared above, 0.5% to 2% w/w photo-initiator, 0.1% to 1% w/w monomer, and 0.1% to 1% w/w additive in a solvent.

Example 5: Preparation of a Pixel Definition Layer and Ink-Jet Printing an Organic Light Emitting Material The mixture for forming the coating layer prepared in Example 4 was coated on a base substrate to form a coating layer. A magnetic field is applied to the coating layer to enrich the hydrophobic magnetic nanoparticles in an upper portion of the coating layer distal to the base substrate, while the solvent is removed under vacuum to cure the coating layer. The magnetic field applied to the coating layer had a magnetic flux density of 0.05 T. The magnetic field was applied for a duration of 10 seconds. The solvent was removed to form a cured coating layer.

The cured coating layer was exposed and developed using a mask plate to remove portions of the cured coating layer, thereby forming a pixel definition layer defining a plurality of subpixel apertures. The pixel definition layer has a plurality of hydrophobic particles enriched in the upper portion of the pixel definition layer for enhancing hydrophobicity of the upper portion of the pixel definition layer.

An ink containing an organic light emitting material is disposed in the plurality of subpixel apertures. Because the upper portion of the pixel definition layer is more hydrophobic, it prevents cross-contamination of the ink disposed in the plurality of subpixel apertures. Because the lower portion of the pixel definition layer is less hydrophobic, it facilitates spreading of the ink throughout the bottom of each of the plurality of subpixel apertures.

Figure 7:
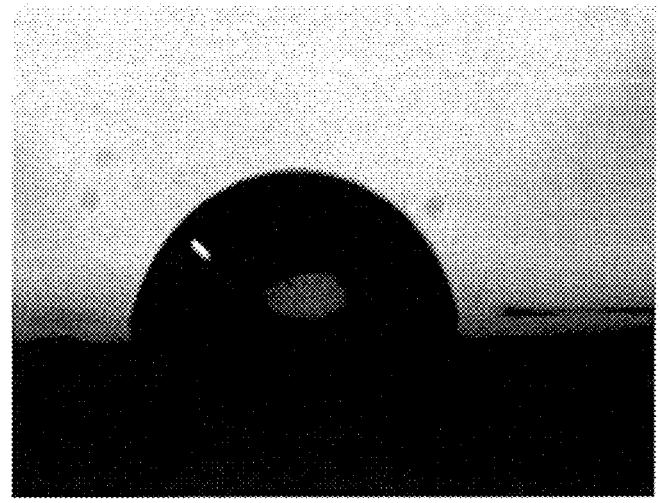
FIG. 7 illustrates a contact angle of an ink droplet on a surface of a pixel definition layer having a plurality of hydrophobic nanoparticle enriched in an upper portion of the pixel definition layer subsequent to application of a magnetic field.
Figure 8:
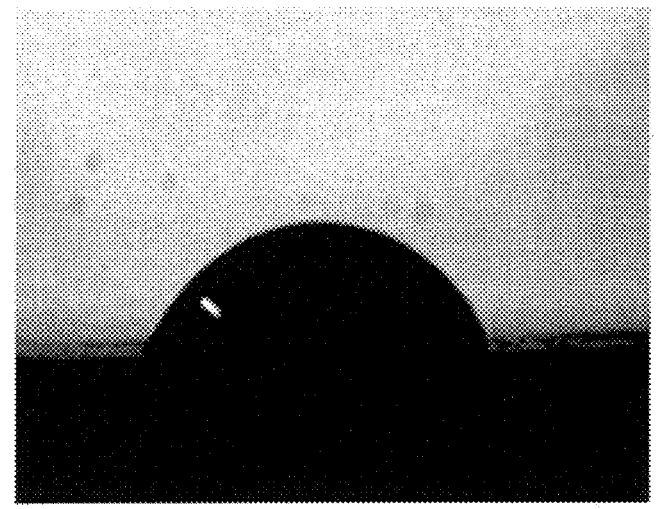
FIG. 8 illustrates a contact angle of an ink droplet on a surface of a pixel definition layer without having a plurality of hydrophobic nanoparticle enriched in an upper portion.

FIG. 7 illustrates an ink droplet on a surface of a pixel definition layer having a plurality of hydrophobic nanoparticle enriched in an upper portion of the pixel definition layer subsequent to application of a magnetic field as described above. The contact angle of the ink droplet is 89 degrees. FIG. 8 illustrates an ink droplet on a surface of a pixel definition layer without having a plurality of hydrophobic nanoparticle enriched in an upper portion. The contact angle of the ink droplet is 69 degrees. As shown in FIG. 7, the pixel definition layer according to the present disclosure has an enhanced hydrophobicity in the upper portion of the pixel definition layer due to the enrichment of the hydrophobic particles therein.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated.

It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display substrate, comprising:
    a base substrate; and
    a single pixel definition layer on the base substrate defining a plurality of subpixel apertures;
    wherein the single pixel definition layer comprises a plurality of hydrophobic particles dispersed in a main body;
    each of the plurality of hydrophobic particles consists of a core portion, an intermediate portion encapsulating the core portion, and a hydrophobic shell portion encapsulating the intermediate portion
    the core portion comprises a magnetic material;
    the intermediate portion comprises an inorganic insulating material; and
    the hydrophobic shell portion comprises an organic insulating material.

2. The display substrate of claim 1, wherein the plurality of hydrophobic particles are in at least an upper portion of the single pixel definition layer distal to the base substrate;
    the upper portion of the single pixel definition layer is more hydrophobic than a lower portion of the single pixel definition layer; and
    the upper portion is on a side of the lower portion distal to the base substrate.

3. The display substrate of claim 1, wherein the core portion comprises $Fe_3O_4$;
    the intermediate portion comprises silicon dioxide;
    the hydrophobic shell portion comprises one or a combination of a fluorinated polydopamine, a block copolymer of methyl methacrylate and dodecafluoroheptyl methacrylate, or a block copolymer of methyl methacrylate and pentafluorostyrene; and
    the main body comprises polymethacrylate.

4. The display substrate of claim 1, wherein a ratio of a hydrophobicity of a surface of each of the plurality of hydrophobic particles to a hydrophobicity of the main body is greater than 2:1.

5. The display substrate of claim 1, wherein a ratio of a hydrophobicity of a surface of each of the plurality of hydrophobic particles to a hydrophobicity of the main body is greater than 4:1.

6. The display substrate of claim 1, wherein the plurality of hydrophobic particles are a plurality of hydrophobic nanoparticles.

7. The display substrate of claim 6, wherein the plurality of hydrophobic nanoparticles are a plurality of hydrophobic magnetic nanoparticles.

8. The display substrate of claim 1, wherein each of the plurality of hydrophobic particles has a core-shell structure comprising a core portion and a hydrophobic shell portion encapsulating the core portion.

9. The display substrate of claim 8, wherein the core portion is a magnetic core portion comprising a magnetic material.

10. The display substrate of claim 9, wherein the core portion comprises $Fe_3O_4$;
the hydrophobic shell portion comprises one or a combination of a fluorinated polydopamine, a block copolymer of methyl methacrylate and dodecafluoroheptyl methacrylate, or a block copolymer of methyl methacrylate and pentafluorostyrene; and
the main body comprises polymethacrylate.

11. The display substrate of claim 1, further comprising an organic light emitting layer in the plurality of subpixel apertures.

12. A display apparatus, comprising the display substrate of claim 1, and a counter substrate facing the display substrate;
wherein the display substrate further comprising an organic light emitting layer in the plurality of subpixel apertures.

13. A method of fabricating a display substrate, comprising forming a pixel definition layer on a base substrate defining a plurality of subpixel apertures;
wherein forming the pixel definition layer comprises:
dispersing a plurality of hydrophobic particles in a main body;
wherein each of the plurality of hydrophobic particles consists of a core portion, an intermediate portion encapsulating the core portion, and a hydrophobic shell portion encapsulating the intermediate portion the core portion comprises a magnetic material;
the intermediate portion comprises an inorganic insulating material; and
the hydrophobic shell portion comprises an organic insulating material.

14. The method of claim 13, wherein the plurality of hydrophobic particles are a plurality of hydrophobic magnetic particles;
forming the pixel definition layer further comprises:
coating a mixture comprising the plurality of hydrophobic particles dispersed in the main body on the base substrate to form a coating layer;
applying a magnetic field to the plurality of hydrophobic particles such that the plurality of hydrophobic particles are enriched in an upper portion of the coating layer distal to the base substrate;
curing the coating layer having the plurality of hydrophobic particles enriched in an upper portion of the coating layer to form a cured coating layer; and
patterning the cured coating layer to form the plurality of subpixel apertures, thereby forming the pixel definition layer.

15. The method of claim 14, wherein the pixel definition layer is formed so that the plurality of hydrophobic particles has a first distribution density in the upper portion of the pixel definition layer and a second distribution density in a lower portion of the pixel definition layer; and
the first distribution density is higher than the second distribution density.

16. The method of claim 15, wherein the pixel definition layer is formed so that the plurality of hydrophobic particles have a gradient distribution such that a distribution density of the plurality of hydrophobic particles decreases in a direction from the upper portion to the lower portion.

17. The method of claim 13, further comprising disposing an ink comprising an organic light emitting material into the plurality of subpixel apertures.

* * * * *